(12) United States Patent
Shepelev et al.

(10) Patent No.: US 11,488,499 B2
(45) Date of Patent: Nov. 1, 2022

(54) STRAIN SENSING IN FOLDABLE DISPLAYS

(71) Applicant: Synaptics Incorporated, San Jose, CA (US)

(72) Inventors: Petr Shepelev, Campbell, CA (US); Takayuki Noto, Tokyo (JP); Takashi Nose, Kanagawa (JP)

(73) Assignee: SYNAPTICS INCORPORATED, San Jose, CA (US)

(*) Notice: Subject to any disclaimer, the term of this patent is extended or adjusted under 35 U.S.C. 154(b) by 100 days.

(21) Appl. No.: 17/085,359

(22) Filed: Oct. 30, 2020

(65) Prior Publication Data
US 2022/0139273 A1 May 5, 2022

(51) Int. Cl.
G09F 9/30 (2006.01)
G01B 7/30 (2006.01)
H01L 41/113 (2006.01)
H01L 51/00 (2006.01)

(52) U.S. Cl.
CPC ............... G09F 9/301 (2013.01); G01B 7/30 (2013.01); H01L 41/1132 (2013.01); H01L 51/0097 (2013.01)

(58) Field of Classification Search
CPC .... G09F 9/301; G06F 1/1652; H01L 41/1132; H01L 51/0097; G01B 7/30
See application file for complete search history.

(56) References Cited

U.S. PATENT DOCUMENTS

| 8,519,449 B2 | 8/2013 | Dumitru et al. |
| 2010/0103133 A1* | 4/2010 | Park ................... G06F 3/03545 345/173 |
| 2011/0260994 A1 | 10/2011 | Saynac |
| 2011/0310079 A1 | 12/2011 | Kim et al. |

(Continued)

FOREIGN PATENT DOCUMENTS

| CN | 111142618 A | * | 5/2020 |
| KR | 20170026046 A | * | 3/2017 |

OTHER PUBLICATIONS

Park et al., "53.5: High-Speed AMOLED Pixel Circuit and Driving Scheme" SID 10 Digest, 2010 • pp. 806-809.

(Continued)

Primary Examiner — Joe H Cheng
(74) Attorney, Agent, or Firm — Paradice & Li LLP

(57) ABSTRACT

A method and apparatus for sensing strain in a flexible electronic display. In some implementations, a display controller may be coupled to an electronic display panel. The display controller is configured to receive sensor signals from one or more piezoresistive sensors disposed in the electronic display panel, determine an amount of strain in the electronic display panel based on the received sensor signals, determine a bend angle of the electronic display panel based on the determined amount of strain, and update a configuration of the electronic display panel based at least in part on the determined bend angle. In some implementations, the electronic display panel may be an organic light-emitting diode (OLED) display panel. In some imple- (Continued)

mentations, the electronic display panel may include a polycrystalline silicon (poly-Si) backplane disposed on a flexible substrate, where each of the piezoresistive sensors includes one or more strain gauges formed on the poly-Si backplane.

17 Claims, 6 Drawing Sheets

(56) References Cited

U.S. PATENT DOCUMENTS

| | | | | |
|---|---|---|---|---|
| 2013/0127606 A1* | 5/2013 | Chang | ............... | G09G 3/006 |
| | | | | 340/384.7 |
| 2013/0265257 A1* | 10/2013 | Jung | ............... | G06F 3/0416 |
| | | | | 345/173 |
| 2014/0055375 A1* | 2/2014 | Kim | ............... | G06F 1/1652 |
| | | | | 345/173 |
| 2014/0070338 A1 | 3/2014 | Wang et al. | | |
| 2014/0240621 A1 | 8/2014 | Klinghult et al. | | |
| 2016/0162241 A1* | 6/2016 | An | ............... | G06F 1/1641 |
| | | | | 345/1.3 |
| 2016/0246330 A1* | 8/2016 | Kim | ............... | G06F 1/1679 |
| 2016/0274397 A1 | 9/2016 | Zhou | | |
| 2017/0090638 A1 | 3/2017 | Vosgueritchian et al. | | |
| 2017/0200037 A1 | 7/2017 | Hong et al. | | |
| 2017/0294151 A1* | 10/2017 | Arai | ............... | G06F 3/04883 |
| 2018/0088629 A1* | 3/2018 | Kim | ............... | G06F 1/1616 |
| 2018/0275795 A1 | 9/2018 | Takahashi | | |
| 2018/0286989 A1 | 10/2018 | Zhang et al. | | |
| 2019/0027674 A1 | 1/2019 | Zhang et al. | | |
| 2019/0243498 A1 | 8/2019 | Wang et al. | | |
| 2021/0397319 A1* | 12/2021 | Li | ............... | H01L 51/0097 |

OTHER PUBLICATIONS

Sohn et al., "Effects of TFT Mobility Variation in the Threshold Voltage Compensation Circuit of the OLED Display," Journal of Information Display, 2017, vol. 18, No. 1, 25-30, https://www.tandfonline.com/doi/pdf/10.1080/15980316.2016.1259128.

U.S. Appl. No. 16/189,486, filed Nov. 13, 2018, 54 pages.

Zhao et al. "Design, Fabrication and Characterization of a High-Sensitivity Pressure Sensor based on Nano-polysilicon Thin Film Transistors," AIP Advances 5, 127216 (2015) (accepted Dec. 7, 2015; published online Dec. 17, 2015, consists of 9 pages.

* cited by examiner

STRAIN SENSING IN FOLDABLE DISPLAYS

TECHNICAL FIELD

The present implementations relate generally to display technologies, and specifically to strain sensing in foldable display devices.

BACKGROUND OF RELATED ART

An electronic display panel is formed from an array of pixel elements (also referred to as "display pixels") arranged in rows and columns. Each row of pixel elements is coupled to a respective gate line, and each column of pixel elements is coupled to a respective source line. More specifically, each pixel element in the array is coupled to a particular gate line and source line via an "access" transistor (such as a metal oxide semiconductor field effect transistor (MOSFET)). For example, the gate of the transistor may be coupled to the gate line while the drain (or source) of the transistor may be coupled to the source line. Thus, each pixel element may be updated by driving a relatively high voltage on its gate line (which turns on the access transistor) and driving new pixel data (as corresponding voltages) on its source line.

The pixel elements form the front plane of the display panel and the access transistors form the backplane. Different display technologies may be used to implement the front plane for different types of displays (such as liquid crystal displays (LCDs) and organic light-emitting diode (OLED) displays). On the other hand, many LCD and OLED displays use thin-film transistor (TFT) technology in the backplane. A TFT layer is created by depositing thin semiconductor (and dielectric) films on a supporting substrate to form an array of access transistors. Glass is a commonly used substrate in many electronic display panels. However, some newer display technologies (such as OLED) can be fabricated on a flexible plastic substrate (such as polyethylene terephthalate (PET)) to produce a flexible display panel.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method and apparatus for sensing strain in a flexible electronic display are disclosed. One innovative aspect of the subject matter of this disclosure can be implemented in a controller for an electronic display panel including processing circuitry and a memory storing instructions that are executable by the processing circuitry. In some implementations, execution of the instructions causes the controller to receive sensor signals from one or more piezoresistive sensors disposed in the electronic display panel, determine an amount of strain in the electronic display panel based on the received sensor signals, determine a bend angle of the electronic display panel based on the determined amount of strain, and update a configuration of the electronic display panel based at least in part on the determined bend angle.

Another innovative aspect of the subject matter of this disclosure can be implemented in a method of sensing strain in an electronic display panel. In some implementations, the method includes steps of receiving sensor signals from one or more piezoresistive sensors disposed in the electronic display panel, determining an amount of strain on the electronic display panel based on the received sensor signals, determining a bend angle of the electronic display panel based on the determined amount of strain, and updating a configuration of the electronic display panel based at least in part on the determined bend angle.

Another innovative aspect of the subject matter of this disclosure can be implemented in a display device including an electronic display panel, one or more piezoresistive sensors disposed in the electronic display panel, and a display controller coupled to the one or more piezoresistive sensors. In some implementations, the display controller is configured to receive sensor signals from the one or more piezoresistive sensors, determine an amount of strain in the electronic display panel based on the received sensor signals, determine a bend angle of the electronic display panel based on the determined amount of strain, and update a configuration of the electronic display panel based at least in part on the determined bend angle.

BRIEF DESCRIPTION OF THE DRAWINGS

The present implementations are illustrated by way of example and are not intended to be limited by the figures of the accompanying drawings.

DETAILED DESCRIPTION

Figure 1:
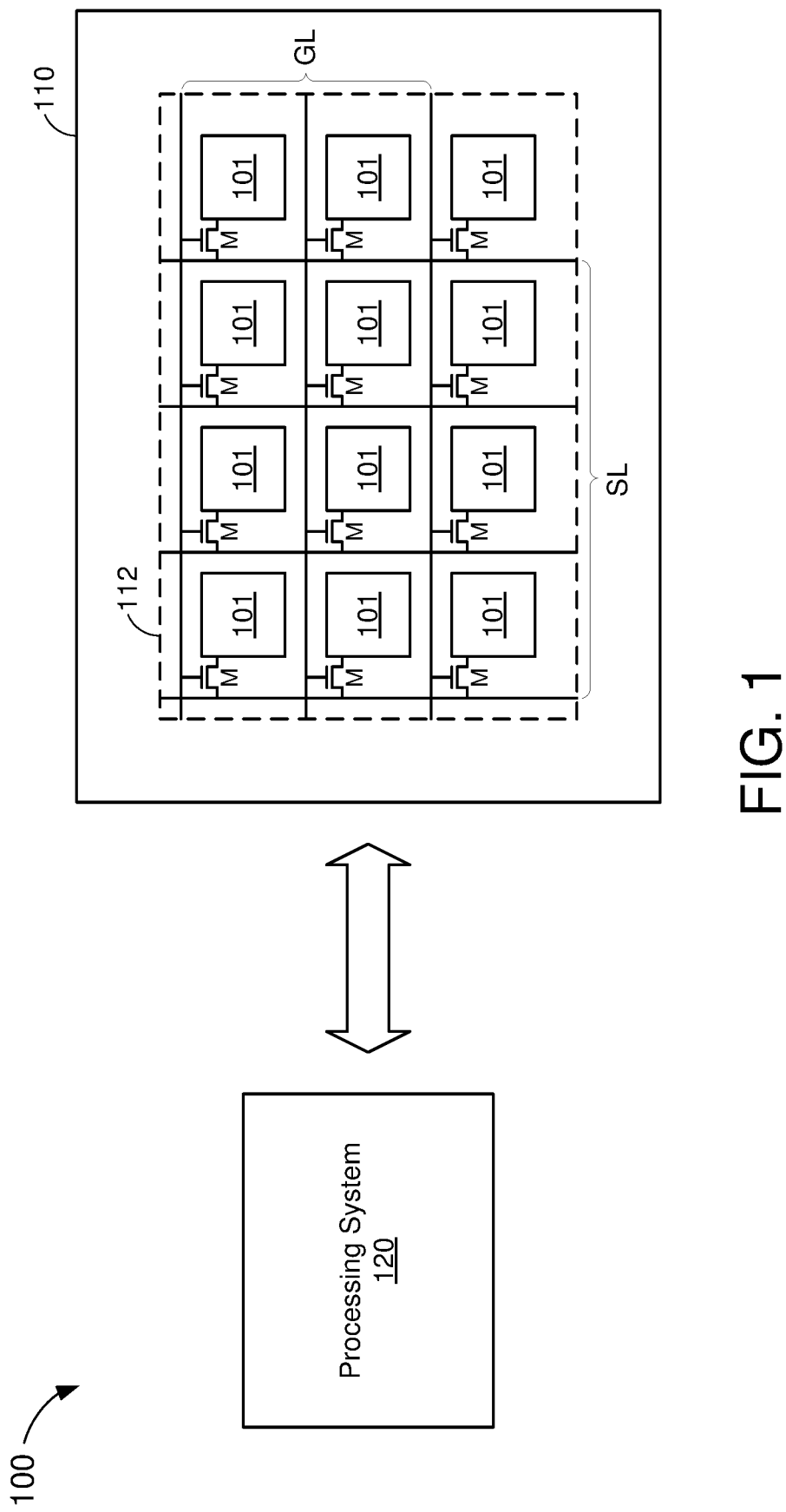
FIG. 1 shows a block diagram of display device.

Various implementations relate generally to flexible electronic display panels. Some implementations more specifically relate to sensing strain in a flexible electronic display panel. In some implementations, a display device may include an electronic display panel, one or more piezoresistive sensors disposed in the electronic display panel, and a display controller coupled to the piezoresistive sensors. The display controller may receive sensor signals from the piezoresistive sensors and determine an amount of strain in the electronic display panel based on the received sensor signals. In some implementations, the display controller may further determine a bend angle of the electronic display panel based on the determined amount of strain. For example, aspects of the present disclosure recognize that bending of the electronic display panel creates strain in one or more layers of the display panel. Thus, the bend angle may correlate with the amount of strain measured in the display panel. In some implementations, the display controller may further update a configuration of the electronic display panel based on the determined bend angle.

Particular implementations of the subject matter described in this disclosure can be implemented to realize one or more of the following potential advantages. By determining the bend angle of the electronic display panel, aspects of the present disclosure may support enhanced features for operating or interacting with the display panel. In some aspects, the display controller may toggle the display panel on or off based on the bend angle. For example, the display controller may deactivate or power off the display when the display panel is folded to a "closed" position and may activate or power on the display when the display panel is unfolded to an "open" position. In some other aspects, the display controller may toggle a power level of the display panel based on the bend angle. For example, the display controller may operate the display in a low-power mode when the display panel is folded to the closed position and may operate the display in a standard power mode when the display panel is unfolded to the open position.

Aspects of the present disclosure also recognize that the strain created by bending the display panel may cause the components of the display to "age" or degrade over time. For example, repeated folding and unfolding of the display panel may result in deformation of input surfaces, delamination or separation of display layers (which may further lead to moisture absorption between the layers), wires breaking, or conductors shorting. In some aspects, the display controller may detect aging or degradation of the display based on the bending of the display panel. For example, the display controller may update a value in a strain buffer each time the display panel is folded or unfolded and may predict a degradation level of the display based on a history of strain recorded in the strain buffer (such as a count value indicating a number of times the display panel has been folded or unfolded). In some aspects, when the display panel is substantially degraded, the display controller may output an alert or indication indicating that the display panel should be replaced or serviced soon.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example implementations. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the implementations disclosed herein may be executed by one or more processors. The term "processor," as used herein may refer to any general-purpose processor, conventional processor, controller, microcontroller, special-purpose processor, and/or state machine capable of executing scripts or instructions of one or more software programs stored in memory.

FIG. 1 shows a block diagram of a display device 100. The display device 100 includes an electronic display panel 110 and a processing system 120. The display device 100 may be configured to display digital images or video for an electronic system (not shown for simplicity). Example suitable electronic systems may include personal computing devices (such as desktop computers, laptop computers, netbook computers, tablets, web browsers, e-book readers, and personal digital assistants (PDAs)), data output devices (such as display screens and printers), remote terminals, kiosks, video game machines (such as video game consoles and portable gaming devices), communication devices (such as cellular phones or smart phones), and media devices (such as televisions, set-top boxes, music players, digital photo frames, digital cameras, and in-car entertainment systems), among other examples.

In some aspects, the display device 100 may be implemented as a physical part of the corresponding electronic system. Alternatively, the display device 100 may be physically separated from the electronic system. The display device 100 may be coupled to (and communicate with) components of the electronic system using various wired and/or wireless interconnection and communication technologies, such as buses and networks. Example suitable technologies may include Inter-Integrated Circuit (I2C), Serial Peripheral Interface (SPI), PS/2, Universal Serial bus (USB), Bluetooth®, Infrared Data Association (IrDA), and various radio frequency (RF) communication protocols defined by the IEEE 802.11 standard, among other examples.

The display panel 110 may be any digital display device capable of displaying digital images or video. The display panel 110 includes an array of pixel elements 101 (also referred to as "display pixels") arranged in rows and columns. Each row of pixel elements 101 may be coupled to a respective gate line (GL) and each column of pixel elements 101 may be coupled to a respective source line (SL). More specifically, each pixel element 101 in the array is coupled to a pair of gate and source lines via a respective access transistor (M). Example suitable access transistors M include P-type metal-oxide semiconductor (PMOS) transistors and N-type metal-oxide semiconductor (NMOS) transistors. For example, the gate of the access transistor M may be coupled to the gate line GL while the source (or drain) of the access transistor M may be coupled to the source line SL. Thus, each pixel element 101 may be updated by driving a relatively high voltage on the gate line GL and driving new pixel data on the source line SL.

The pixel elements 101 form the front plane of the display panel 110 and the access transistors M form the backplane. Different display technologies may be used to implement the front plane for different types of displays. Example suitable display technologies include light emitting diode (LED), organic LED (OLED), cathode ray tube (CRT), liquid crystal display (LCD), plasma, and electroluminescence (EL), among other examples. However, thin-film transistor (TFT) technology is commonly used in the backplane (such as in LCDs and OLED displays). A TFT layer is created by depositing thin semiconductor (and dielectric) films on a supporting substrate to form the array of access transistors M. In some implementations, the array of access transistors M (and pixel elements 101) may be disposed in an active area 112 of the display panel 110.

In some implementations, the active area 112 also may represent a sensing region of a proximity sensor device (also referred to as a "touch sensor device"). For example, the display device 100 may include a touch screen interface that at least partially overlaps or coincides with the active area 112. The display device 100 may be configured to sense input provided by one or more input objects in the sensing region. Example input objects include fingers, styli, active pens, among other examples. The sensing region may encompass any space above, around, in, and/or proximate to the display device 100. In some implementations, the sensing region may extend from a surface of the display device 100 in one or more directions in space, for example, until a signal-to-noise ratio (SNR) of the sensors falls below a threshold suitable for object detection. In some implementations, the sensing region may detect inputs involving no physical contact with any surfaces of the display device 100, contact with an input surface (such as the display panel 110) of the display device 100, or contact with an input surface of the display device 100 coupled with some amount of applied force or pressure.

The display device 100 may utilize various sensing technologies to detect user input. Example suitable sensing technologies may include capacitive, elastive, resistive, inductive, magnetic, acoustic, ultrasonic, and optical sensing technologies. In some implementations, the display device 100 may utilize capacitive sensing technologies to detect user inputs. For example, the active area 112 may further include one or more capacitive sensing elements (also referred to as sensor electrodes) to create an electric field. The sensor electrodes of the input device 100 may form a substantially transparent overlay on the display panel 110, thereby providing a touch screen interface for the associated electronic system. The display device 100 may detect inputs based on changes in capacitance of the sensor electrodes. For example, an object in contact with (or close proximity to) the electric field may cause changes in the voltage and/or current in the sensor electrodes. Such changes in voltage or current may be detected as "signals" indicative of user input.

Example suitable capacitive sensing technologies may be based on "self-capacitance" (also referred to as "absolute capacitance") or "mutual capacitance" (also referred to as "transcapacitance"). Absolute capacitance sensing techniques detect changes in the capacitive coupling between sensor electrodes and an input object. For example, an input object near the sensor electrodes may alter the electric field near the sensor electrodes, thus changing the measured capacitive coupling. Transcapacitance sensing techniques detect changes in the capacitive coupling between sensor electrodes. For example, an input object near the sensor electrodes may alter the electric field between one or more "transmitter" sensor electrodes and one or more "receiver" sensor electrodes. In some implementations, the transmitter sensor electrodes may be modulated relative to a reference voltage to transmit signals, while the receiver sensor electrodes may be held at a relatively constant voltage to "receive" the transmitted signals. The sensor electrodes may be arranged in arrays or other configurations to detect inputs at multiple points within the sensing region.

In some implementations, one or more of the sensor electrodes may be used in and sensing inputs and displaying images in the active area 112. For example, a sensor electrode used for sensing inputs may also operate as a display electrode (such as a gate line GL or source line SL) coupled to one or more of the pixel elements 101. In some implementations, the display device 100 may include a first sensor electrode configured for displaying at least part of an image and sensing inputs, and a second sensor electrode may be configured for input sensing only. For example, the second sensor electrode may be disposed between substrates of the display panel 110 or may be external to the display device 110.

The processing system 120 may be configured to operate the hardware of the display device 100. In some implementations, one or more components of the processing system 120 may be co-located with the display panel 110. For example, the display device 100 may be physically integrated in a mobile device, and the processing system 120 may correspond, at least in part, to a central processing unit (CPU) of the mobile device. In some other implementations, one or more components of the processing system 120 may be physically separated from the display panel 110. For example, the display device 100 may be a peripheral coupled to a computing device, and the processing system 120 may be implemented as software executed by a CPU of the computing device. In some implementations, the processing system 120 may be implemented as a set of modules that are implemented in firmware, software, or a combination thereof.

In some implementations, the processing system 120 may control one or more sensor electrodes to detect objects in the sensing region. For example, the processing system 120 may be configured to transmit signals via one or more transmitter sensor electrodes and receive signals via one or more receiver sensor electrodes. More specifically, the processing system 120 may operate the sensing elements of the display device 100 to produce electrical signals indicative of input (or lack of input) in the sensing region. The processing system 120 may perform any appropriate amount of processing on the electrical signals to translate or generate the information provided to the electronic system. In some aspects, the processing system 120 may subtract or otherwise account for a "baseline" associated with the sensor electrodes. For example, the baseline may represent a state of the sensor electrodes when no user input is detected.

In some other implementations, the processing system 120 may receive image data from an image source (not shown for simplicity) and process or render the image data for display in the active area 112. For example, in some aspects, the image data may correspond to a graphical user interface (GUI). The processing system 120 may control one or more of the pixel elements 101 to display the image data by driving voltages onto the gate lines GL and source lines SL. In some aspects, the processing system 120 may be configured to execute instructions related to sensing inputs and displaying images. For example, the processing system 120 may drive a display electrode to display at least a portion of an image and sense user inputs, concurrently. In another example, the processing system 120 may drive a first display electrode to display at least a portion of the image while concurrently driving a second display electrode to sense user inputs.

In some implementations, the processing system 120 may respond to user input in the sensing region by triggering one or more actions. Example actions include changing an operation mode of the display device 100 or GUI actions such as cursor movement, selection, and menu navigation, among other examples. In some implementations, the processing system 120 may provide information about the detected input to the electronic system (such as to a CPU). The electronic system may process the received information to carry out additional actions (such as GUI actions or changing a mode of the electronic system). In some implementations, the processing system 120 may further determine positional information for a detected input. The term "positional information," as used herein, refers to any information describing or otherwise indicating a position or location of the detected input. Example positional information may include absolute position, relative position, velocity, acceleration, and/or other types of spatial information.

As described above, the access transistors M are formed in a TFT layer deposited on a supporting substrate. In some implementations, the supporting substrate may be a flexible substrate (such as polyethylene terephthalate (PET) or other types of plastic). In such implementations, the display panel 110 may be a flexible display panel (such as a flexible OLED display). As used herein, the term "flexible display panel" may refer to any display panel configured to bend or flex without damaging the device. For example, a flexible display panel may be folded or rolled to create a smaller footprint. Aspects of the present disclosure recognize that bending the display panel 110 may add another dimension to the functioning of the display device 100. In some implementations, the processing system 120 may support enhanced features for operating or interacting with the display device 100 based, at least in part, on a bend angle of the display panel 110.

Figure 2:
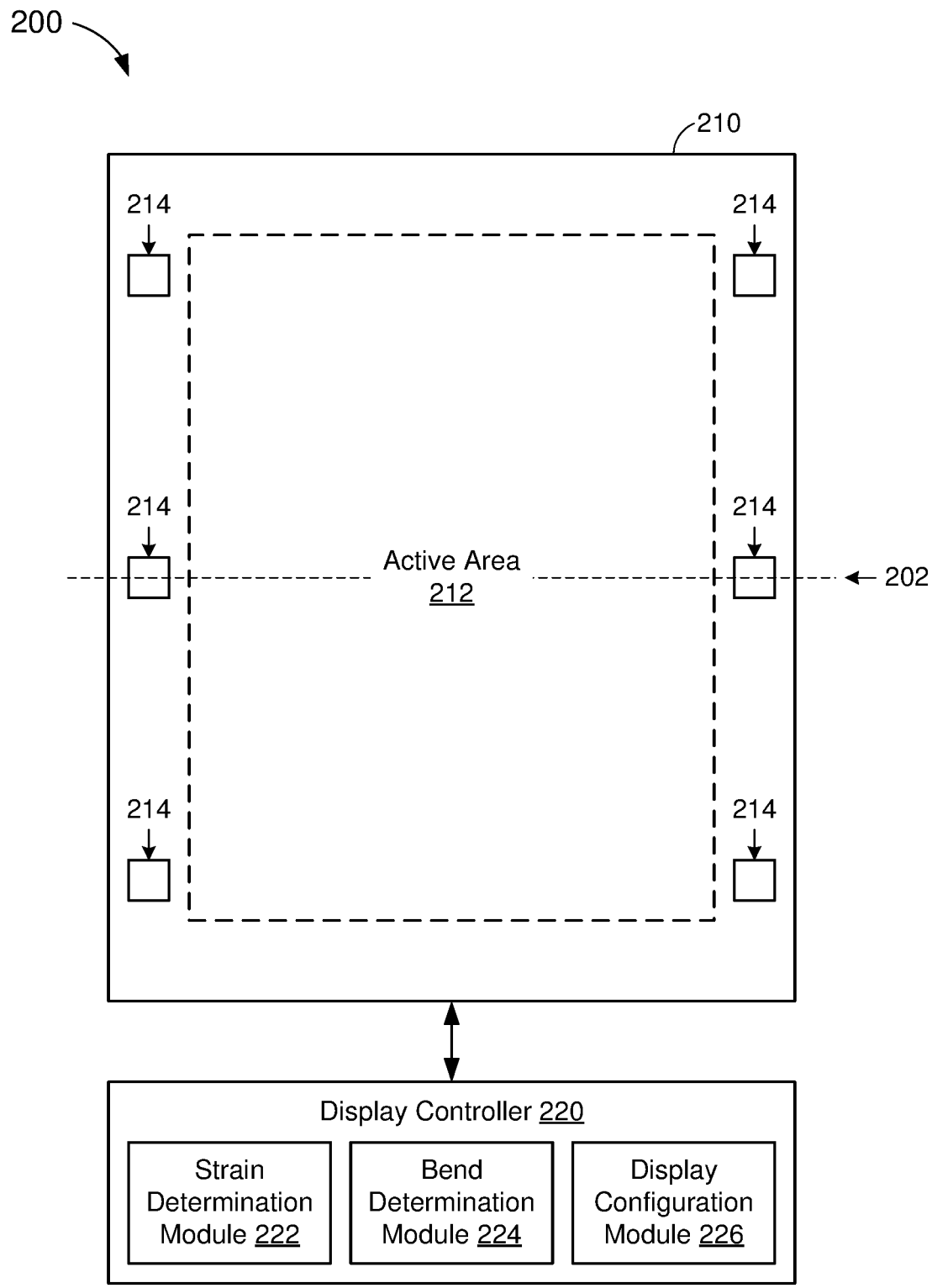
FIG. 2 shows an example display device according to some implementations.

FIG. 2 shows an example display device 200 according to some implementations. The display device 200 includes a flexible electronic display panel 210 and a display controller 220. In some implementations, the flexible display panel 210 may be one example of the display panel 110 of FIG. 1. In some implementations, the display controller 220 may be one example of the processing system 120 of FIG. 1.

The flexible display panel 210 may be any suitable display panel capable of bending or flexing. For example, the flexible display panel 210 may include a TFT backplane deposited on a flexible substrate (such as PET). In some implementations, the flexible display panel 210 may be a flexible OLED display. For example, the flexible display panel 210 may include an OLED front plane fabricated on the flexible substrate. In some other implementations, the front plane of the flexible display panel 210 may be fabricated based on other display technologies. The front plane of the flexible display panel 210 includes an array of display pixels (such as the pixel elements 101 of FIG. 1) and the backplane of the display panel includes an array of access transistors (such as the access transistors M of FIG. 1) coupled to the display pixels. In some implementations, the display pixels and access transistors are disposed within an active area 212 of the display panel 210. In some other implementations, the active area 212 also may include sensor electrodes for detecting proximity-based user inputs. Thus, the active area 212 may represent a region of the display panel 210 configured for displaying images or sensing user inputs.

In some implementations, the flexible display panel 210 may be configured to bend or fold along a first axis 202 (also referred to herein as a "bend axis"). In the example of FIG. 2, the bend axis 202 bifurcates the display panel 210. Thus, in some aspects, the top half of the display panel 210 may be folded over the bottom half of the display panel 210 to create a smaller footprint or form factor. Aspects of the present disclosure recognize that bending of the display creates strain in one or more layers of the flexible display panel 210. In some implementations, the flexible display panel 210 may include one or more strain sensors 214 to detect the strain in the display panel 210. In the example of FIG. 2, the flexible display panel 210 is shown to include 6 strain sensors 214 distributed along the edges of the display panel 210 that are perpendicular to the bend axis 202. However, in actual implementations, the flexible display panel 210 may include any number of strain sensors 214 disposed in any arrangement in the display panel 210. In some implementations, the strain sensors 214 may be disposed in locations or layers of the display panel 210 under maximum strain (when the display panel 210 is folded).

Each of the strain sensors 214 may be a piezoresistive sensor formed from one or more strain gauges. For example, a strain gauge may be any component or device having strain-dependent resistive properties. More specifically, the resistance of the strain gauge changes in response to an amount of strain in the strain gauge or an underlying specimen on which the strain gauge is deposited. In some implementations, a strain gauge may be formed from a material having a high gauge factor (GF). The gauge factor is defined as a ratio of the fractional change in resistance (ΔR/R) to the fractional change in strain (ε) of a given material. Aspects of the present disclosure recognize that the resistance of the strain gauge material also may vary in response to changes in temperature. In some implementations, the strain gauges may be configured in a Wheatstone bridge configuration. For example, the strain gauges may be configured in full-bridge configurations or half-bridge configurations to mitigate the effects of temperature on the strain sensors 214.

Figure 3A:
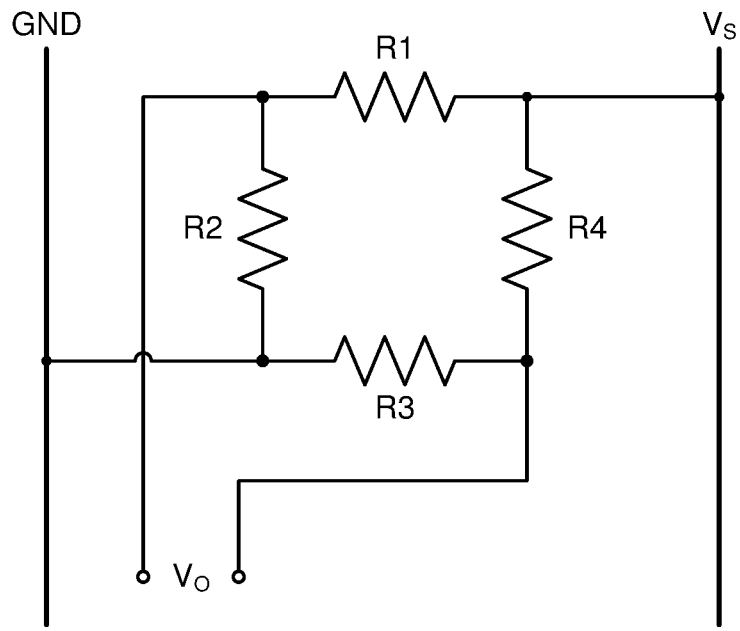
FIGS. 3A and 3B show example piezoresistive sensors suitable for sensing strain in a flexible display panel.

FIG. 3A shows an example piezoresistive sensor 300 suitable for sensing strain in a flexible display panel. In some implementations, the piezoresistive sensor 300 may be one example of any of the strain sensors 214 of FIG. 2. The piezoresistive sensor 300 includes four resistors R1-R4 coupled in a Wheatstone bridge configuration. In the example of FIG. 3A, a supply voltage ($V_S$) is coupled to the intersection of resistors R1 and R4 and a ground potential (GND) is coupled to the intersection of resistors R2 and R3. An output voltage ($V_O$) may be measured between the intersection of resistors R1 and R2 and the intersection of resistors R3 and R4. In this configuration, resistors R1 and R4 represent a first voltage divider circuit while resistors R2 and R3 represent a second voltage divider circuit. Thus, the output voltage $V_O$ can be expressed as a function of the resistances $R_1$-$R_4$ of the resistors R1-R4, respectively:

$$V_O = \left[\frac{R_3}{R_3 + R_4} - \frac{R_2}{R_1 + R_2}\right]V_S$$

In some implementations, one or more of the resistors R1-R4 may be implemented as a strain gauge. More specifically, the strain gauges may be configured such that $R_1/R_2 = R_4/R_3$ when the piezoresistive sensor 300 is in a quiescent state (such as when the strain gauges are not under stress). In this state, the Wheatstone bridge is balanced, and the output voltage $V_O$ is equal to zero. However, mechanical stress or strain in the piezoresistive sensor 300 changes the resistances of the strain gauges, resulting in a non-zero output voltage $V_O$. The value of the output voltage $V_O$ can be measured and correlated with the amount of strain in the piezoresistive sensor 300 or the underlying specimen. With reference for example to FIG. 2, the display controller 220 may be coupled to the intersection of resistors R1 and R2 and the intersection of resistors R3 and R4, via respective leads, to detect the output voltage $V_O$.

As described above, the resistance of a strain gauge may vary in response to changes in temperature. In some implementations, the piezoresistive sensor 300 may have a substantially small form factor (~0.3 mm) which reduces or minimizes the temperature gradient in the strain gauges. In some other implementations, the piezoresistive sensor 300 may be disposed along the edges or perimeter of the display panel. With reference for example to FIG. 2, the strain sensors 214 are disposed along the perimeter of the display panel 210, outside the active area 212. As a result, the routing of the leads to each strain sensor 214 can be configured in a manner which substantially reduces the resistances of the leads. Aspects of the present disclosure recognize that variations in temperature also can be mitigated across two or more strain gauges. In some implementations, two of the resistors R1-R4 may be implemented as strain gauges, for example, in a "half-bridge" configuration. In some other implementations, all four resistors R1-R4 may be implemented as strain gauges, for example, in a "full-bridge" configuration.

Figure 3B:
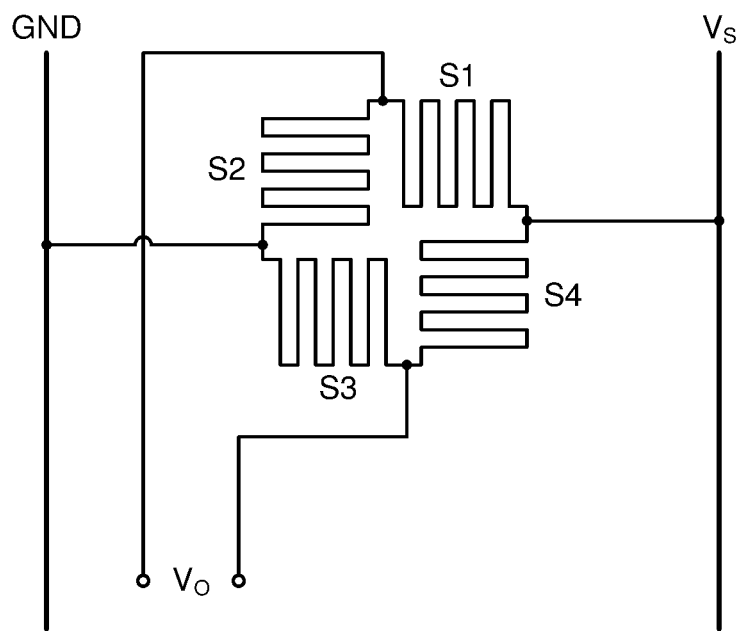

FIG. 3B shows another example piezoresistive sensor 310 suitable for sensing strain in a flexible display panel. The piezoresistive sensor 310 includes four strain gauges S1-S4 coupled in a Wheatstone bridge configuration. Specifically, in the example of FIG. 3B, the strain gauges S1-S4 are arranged in a full-bridge configuration. In some implementations, the strain gauges S1-S4 may be examples of resistors R1-R4, respectively, of FIG. 1. For example, a supply voltage ($V_S$) may be coupled to the intersection of strain gauges S1 and S4 and a ground potential (GND) may be coupled to the intersection of strain gauge S2 and S3. An output voltage ($V_O$) may be measured between the intersection of strain gauges S1 and S2 and the intersection of strain gauges S3 and S4. Thus, the output voltage $V_O$ can be expressed as a function of the resistances $R_1$-$R_4$ of the strain gauges S1-S4, respectively (such as described with reference to FIG. 3A).

In some implementations, the piezoresistive sensor 310 may be configured to measure strain in multiple directions. For example, strain gauges S2 and S4 may be configured to detect horizontal strain ($\varepsilon_x$) in the flexible display panel and strain gauges S1 and S3 may be configured to detect vertical strain ($\varepsilon_y$) in the flexible display panel. Further, any changes in temperature will have substantially the same effect on each of the strain gauges S1-S4. Because the temperature effects on strain gauges S1-S4 are equal, the ratios of the resistances $R_1/R_2$ and $R_4/R_3$ do not change. As a result, the temperature effects on the output voltage $V_O$ are nullified.

In some implementations, the strain gauges S1-S4 may be disposed on the backplane or TFT layer of the flexible display panel. Example suitable backplane materials include amorphous silicon (aSi), low-temperature polycrystalline silicon (LTPS), indium gallium zinc oxide (IGZO), and low-temperature polycrystalline oxide (LTPO), among other examples. Aspects of the present disclosure recognize that polycrystalline silicon (poly-Si) can be doped to achieve a relatively high gauge factor (10<GF<30) while maintaining a relatively low temperature coefficient of resistance (α~1). Thus, in some implementations, the strain gauges S1-S4 may be formed on a poly-Si backplane (based on LTPS or LTPO technology). For example, a layer of poly-Si material may be doped to create the strain gauges S1-S4. With reference for example to FIGS. 1 and 2, the poly-Si material may be used in the backplanes of display panels 110 and 210. Thus, the access transistors M also may be formed on the poly-Si material.

Referring back to FIG. 2, the display controller 220 is configured to receive sensor signals from the strain sensors 214. The display controller 220 may be implemented by, or include at least a portion of, a processing system (such as processing system 110) that controls an operation of the display panel 210. In some aspects, the display controller 220 may send pixel update signals to one or more display pixels in the display panel 210. In some other aspects, the display controller 220 may receive sensor signals from one or more sensors (such as sensor electrodes or strain sensors 214) in the display panel 210. Still further, in some aspects, the display controller 220 may change a configuration or operating mode of the display panel 210. In some implementations, the display controller 220 may include a strain determination module 222, a bend determination module 224, and a display configuration module 226.

The strain determination module 222 may determine an amount of strain in the display panel 210 based on sensor signals received from one or more of the strain sensors 214. As described above with reference to FIGS. 3A and 3B, the strain in the display panel 210 may be proportional to a change in the output voltage $V_O$ of one or more of the strain sensors 214. In some aspects, the sensor signals received from each strain sensor 214 may be representative of its output voltage $V_O$. Thus, the strain determination module 222 may determine the amount of strain in the display panel 210 based on changes in the output voltage $V_O$ of one or more of the strain sensors 214. In some implementations, the strain determination module 222 may sense different amounts of strain from strain sensors 214 disposed at different locations in the display panel 210 in response to various inputs or stimuli.

Figure 4A:
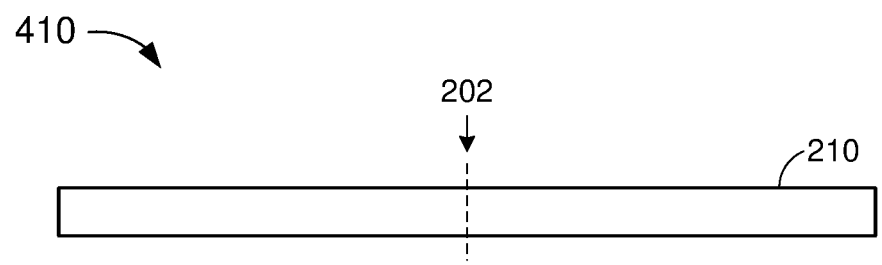
FIGS. 4A-4C show side views of a flexible display panel with various degrees of bend angle.
Figure 4B:
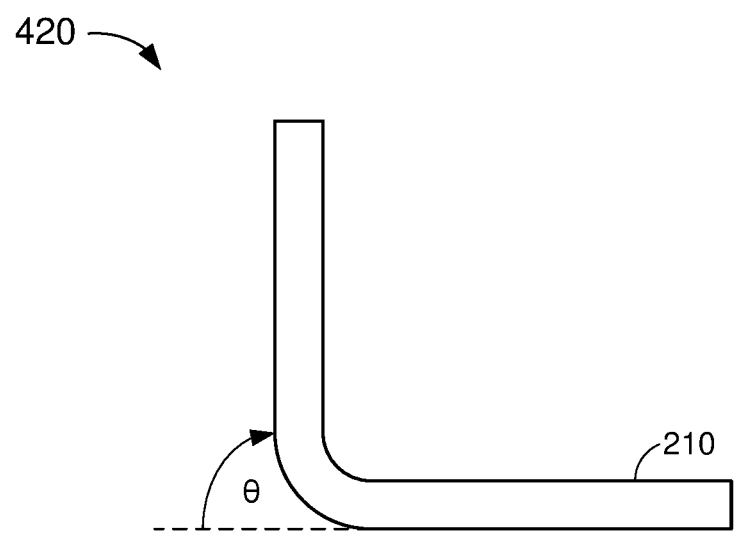
Figure 4C:
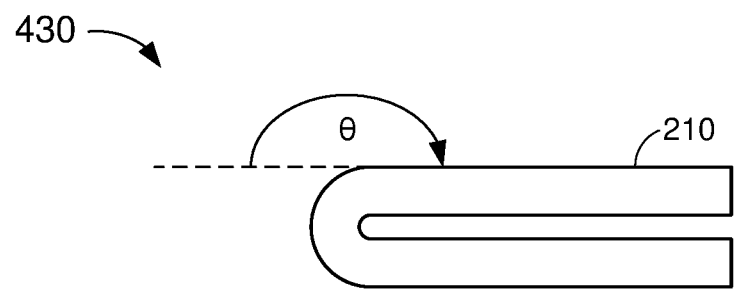

The bend determination module 224 may determine a bend angle of the display panel 210 based on the determined amount of strain. Aspects of the present disclosure recognize that the bending or folding of the display creates strain in one or more layers of the display panel 210. Generally, greater bender angles produce greater amounts of strain in the display panel 210. FIGS. 4A-4C show side views 410-430, respectively, of the flexible display panel 210 with various degrees of bend angle (θ). More specifically, FIG. 4A shows the display panel 210 in an unfolded (or "open") position (θ=0°), FIG. 4B shows the display panel 210 in a partially folded position (θ=90°), and FIG. 4C shows the display panel 210 in a folded (or "closed") position (θ=180°). In some implementations, the strain sensors 214 may sense greater strain when the display panel 210 is in the folded position than the partially folded position, and may sense greater strain when the display panel 210 is in the partially folded position than the unfolded position.

In some implementations, the bend determination module 224 may associate the amount of strain in the display panel 210 with a unique bend angle. For example, the bend determination module 224 may determine the bend angle to be any angle between 0° and 180°. In some other implementations, the bend determination module 224 may associate the amount of strain in the display panel 210 with the open or closed position. For example, the bend determination module 224 may determine that the display panel 210 is in the open position if the bend angle is less than a threshold bend angle (such as θ<90°) and may determine that the display panel 210 is in the closed position if the bend angle is greater than a threshold bend angle (such as θ>90°).

The display configuration module 226 is configured to update a configuration of the display panel 210 based, at least in part, on the bend angle determined by the bend determination module 224 or the amount of strain determined by the strain determination module 222. In some implementations, the display configuration module 226 may interpret the strain sensed by one or more of the strain sensors 214 as force inputs provided by an input object. For example, the display configuration module 226 may determine positional information associated with the force input based on the amount of strain detected by each of the strain sensors 214 and the locations of the strain sensors 214 in the display panel 210. In some aspects, the display configuration module 226 may update a GUI displayed on the display panel 210 based on the force input.

In some other implementations, the display configuration module 226 may toggle the display panel 210 on or off based on the determined bend angle. For example, the display configuration module 226 may deactivate or power off the display panel 210 when folded to the closed position and may activate or power on the display panel 210 when unfolded to the open position. Still further, in some other implementations, the display configuration module 226 may toggle a power level of the display panel based on the determined bend angle. For example, the display configuration module 226 may operate the display panel 210 in a low-power mode when folded to the closed position and may operate the display panel 210 in a standard power mode when unfolded to the open position. In some aspects, the display configuration module 226 may activate an always-on-display (AOD) feature of the display panel 210 or another display panel (not shown) of the display device 200 when the display panel 210 is folded to the closed position.

Aspects of the present disclosure also recognize that the strain created by the bending of the display panel 210 may cause the components of the display panel 210 to age or degrade over time. For example, repeated folding and unfolding of the display panel 210 may result in deformation of input surfaces, delamination or separation of display layers (which may further lead to moisture absorption between the layers), wires breaking, or conductors shorting. In some implementations, the display configuration module 226 may detect aging or degradation of the display panel 210 based, at least in part, on the determined bend angle. For example, the display configuration module 226 may update a value in a strain buffer (not shown for simplicity) each time the display panel 210 is folded or unfolded and may predict a degradation level of the display based on a history of strain recorded in the strain buffer. In some aspects, the strain buffer may record the amount of strain detected in the display panel 210 each time the display panel is folded or unfolded. In some other aspects, the strain buffer may store a count value indicating a number of times the display panel has been folded or unfolded. In some implementations, the display configuration module 226 may determine that the display panel is substantially degraded based on the history of strain recorded in the strain buffer, and output an indication (for example, to the display panel 210) signaling that the display panel 210 should be replaced or serviced soon.

Figure 5:
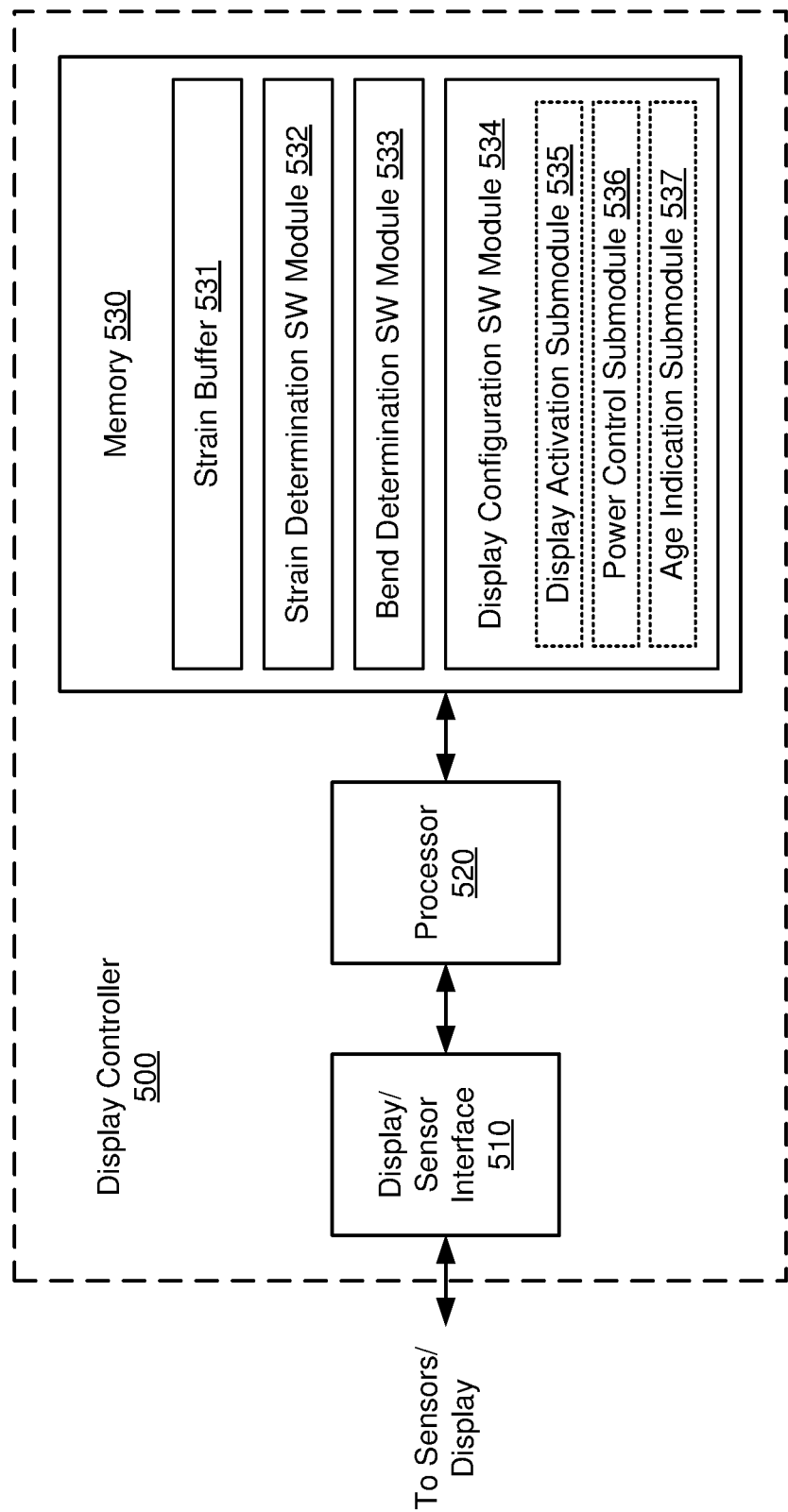
FIG. 5 shows a block diagram of a display controller according to some implementations.

FIG. 5 shows a block diagram of a display controller 500 according to some implementations. The display controller 500 includes a display and sensor interface 510, a processor 520, and a memory 530. In some implementations, the display controller 500 may be one example of the processing system 110 of FIG. 1 or the display controller 200 of FIG. 2.

The display and sensor interface 510 may be used to communicate with a display panel (such as the display panels 110 or 210 of FIGS. 1 and 2, respectively). In some implementations, the display and sensor interface 510 may be configured to transmit signals to one or more display pixels (such as display pixels 101 of FIG. 1) to display an image or GUI on the display panel. In some other implementations, the display and sensor interface 510 may receive signals from one or more strain sensors to detect strain in the display panel. Still further, in some implementations, the display and sensor interface 510 may receive signals from one or more capacitive sensors to detect user inputs in a sensing region of the display panel.

In some implementations, the memory 530 may include a strain buffer 531 to store one or more values indicating a history of strain in the display panel. In some aspects, the strain buffer 531 may record the amount of strain detected in the display panel each time the display panel is folded or unfolded. In some other aspects, the strain buffer 531 may store a count value indicating a number of times the display panel has been folded or unfolded. The memory 530 also may include a non-transitory computer-readable medium (e.g., one or more nonvolatile memory elements, such as EPROM, EEPROM, Flash memory, a hard drive, etc.) that may store at least the following software (SW) modules:

- a strain determination SW module 532 to determine an amount of strain in the display panel based on signals received from the strain sensors;
- a bend determination SW module 533 to determine a bend angle of the display panel based on the determined amount of strain; and
- a display configuration SW module 534 to update a configuration of the display panel based at least in part on the determined bend angle, where the display configuration SW module 534 further includes:
  - a display activation submodule 535 to deactivate or activate the display panel based on whether the bend angle is greater than or less than a threshold bend angle;
  - a power control submodule 536 to operate the display panel in a low power mode or a standard power mode based on whether the bend angle is greater than or less than a threshold bend angle; and
  - an age indication submodule 537 to update a value in the strain buffer 531 based on the determined amount of strain and to output an indication signaling a degradation of the display panel based on the history of strain indicated in the strain buffer 531.

Each software module includes instructions that, when executed by the processor 520, cause the controller 500 to perform the corresponding functions. The non-transitory computer-readable medium of memory 530 thus includes instructions for performing all or a portion of the operations described below with respect to FIG. 6.

Processor 520 may be any suitable one or more processors capable of executing scripts or instructions of one or more software programs stored in memory 530. In some implementations, the processor 520 may execute the strain determination SW module 532 to determine an amount of strain in the display panel based on signals received from the strain sensors. In some other implementations, the processor 520 also may execute the bend determination SW module 533 to determine a bend angle of the display panel based on the determined amount of strain. Still further, in some implementations, the processor 520 may execute the display configuration SW module 534 to update a configuration of the display panel based at least in part on the determined bend angle. In executing the display configuration SW module 534, the processor 520 may further execute the display activation submodule 535, the power control submodule 536, or the age indication submodule 537.

In some implementations, the processor 520 may execute the display activation submodule 535 to deactivate or activate the display panel based on whether the bend angle is greater than or less than a threshold bend angle. In some other implementations, the processor 520 may execute the power control submodule 536 to operate the display panel in a low power mode or a standard power mode based on whether the bend angle is greater than or less than a threshold bend angle. Still further, in some implementations, the processor 520 may execute the age indication submodule 537 to update a value in the strain buffer 531 based on the determined amount of strain and to output an indication signaling a degradation of the display panel based on the history of strain indicated in the strain buffer 531.

Figure 6:
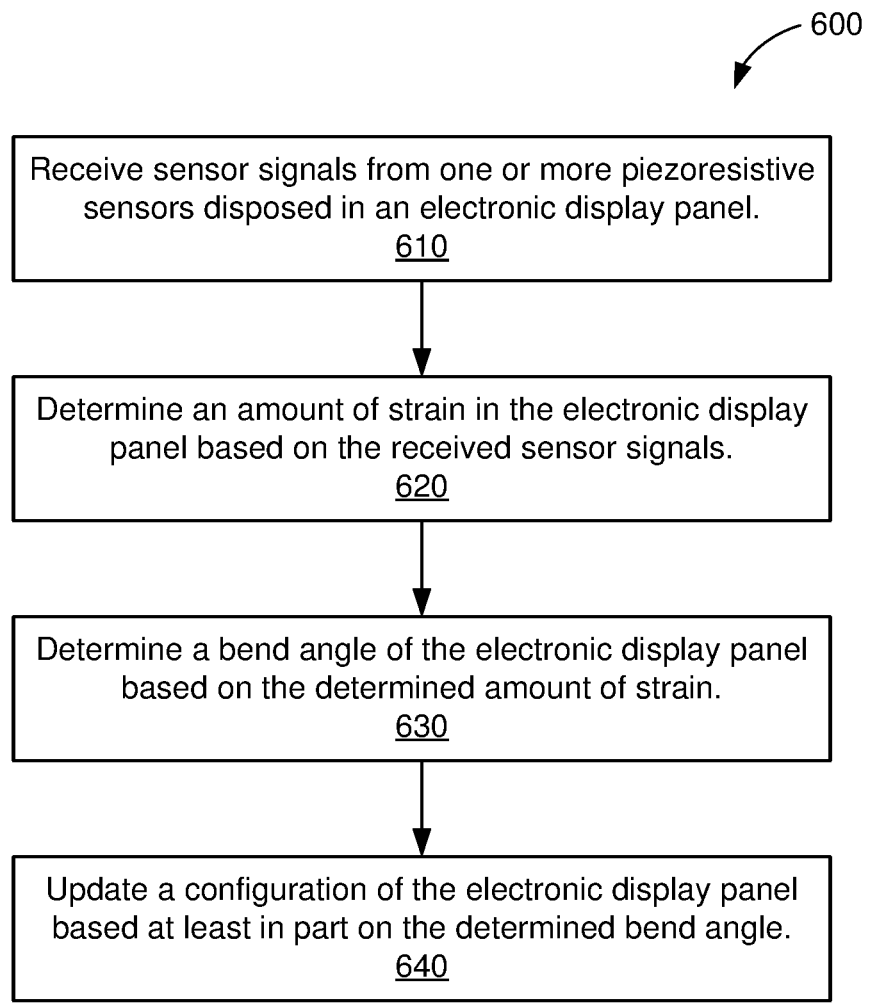
FIG. 6 shows an illustrative flowchart depicting an example strain sensing operation according to some implementations.

FIG. 6 shows an illustrative flowchart depicting an example strain sensing operation 600 according to some implementations. In some implementations, the example operation 600 may be performed by a display controller coupled to a flexible display panel. With reference for example to FIG. 2, the strain sensing operation 600 may be performed by the display controller 220 to control or operate the display panel 210 based on strain detected therein.

The display controller receives sensor signals from one or more piezoresistive sensors disposed in the electronic display panel (610). In some implementations, the piezoresistive sensors may be disposed along the perimeter of the display panel, outside an active area. For example, each of the piezoresistive sensors may include one or more strain gauges. In some implementations, the strain gauges may be configured in a Wheatstone bridge configuration, such as described with reference to FIGS. 3A and 3B. For example, the strain gauges may be arranged in full-bridge or half-bridge configurations to mitigate the effects of temperature on the resistance of each strain gauge. In some implementations, the strain gauges may be formed on a poly-Si backplane (based on LTPS or LTPO technology).

The display controller determines an amount of strain in the electronic display panel based on the received sensor signals (620). For example, the sensor signals received from each piezoresistive sensor may be representative of its output voltage $V_O$. As described above with reference to FIGS. 3A and 3B, the strain in the display panel cause changes in the output voltage $V_O$ of one or more of the piezoresistive sensors. Thus, in some implementations, the display controller may determine the amount of strain in the display panel based on changes in the output voltage $V_O$ of one or more of the piezoresistive sensors. In some implementations, the display controller may sense different amounts of strain from piezoresistive sensors disposed at different locations in the display panel.

The display controller further determines a bend angle of the electronic display panel based on the determined amount of strain (630). Aspects of the present disclosure recognize that the bending or folding of the display creates strain in one or more layers of the display panel. Generally, greater bender angles produce greater amounts of strain in the display panel. In some implementations, the display controller may associate the amount of strain in the display panel with a unique bend angle. For example, the display controller may determine the bend angle to be any angle between 0° and 180°. In some other implementations, the display controller may associate the amount of strain in the display panel with an open position (such as when the bend angle is less than a threshold bend angle) or a closed position (such as when the bend angle is greater than a threshold bend angle).

The display controller updates a configuration of the electronic display panel based at least in part on the determined bend angle (640). In some implementations, the display controller may toggle the display panel on or off based on the determined bend angle. In some other implementations, the display controller may toggle a power level of the display panel based on the determined bend angle. Still further, in some implementations, the display controller may detect aging or degradation of the display panel based, at least in part, on the determined bend angle. For example, the display controller may update a value in a strain buffer each time the display panel is folded or unfolded and may predict a degradation level of the display based on a history of strain recorded in the strain buffer. In some aspects, the display controller may determine that the display panel is substantially degraded based on the history of strain recorded in the strain buffer, and output an indication signaling that the display panel should be replaced or serviced soon.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, implementations have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A controller for an electronic display panel, comprising; processing circuitry; and
a memory storing instructions that, when executed the processing circuitry, causes the controller to:
receive sensor signals from one or more piezoresistive sensors disposed in the electronic display panel;
determine an amount of strain in the electronic display panel based on the received sensor signals;
determine a bend angle of the electronic display panel based on the determined amount of strain; and
update a value in a strain buffer based on the determined amount of strain, the strain buffer storing one or more values indicating a history of strain in the electronic display panel.

2. The controller of claim , wherein execution of the instructions further causes the controller to:
determine that the bend angle of the electronic display panel is greater than a threshold bend angle; and
deactivate the electronic display panel based on determining that the bend angle is greater than the threshold bend angle.

3. The controller of claim 1, wherein execution of the instructions further causes the controller to:
determine that the bend angle of the electronic display panel is less than a threshold bend angle; and
activate the electronic display panel based on determining that the bend angle does not exceed the threshold bend angle.

4. The controller of claim 1, wherein execution of the instructions further causes the controller to:
determine that the bend angle of the electronic display panel is greater than a threshold bend angle and
operate the electronic display panel a low power mode based on determining that the bend angle is greater than the threshold bend angle.

5. The controller of claim 1, wherein execution of the instructions further causes the controller to:
determine that the bend angle of the electronic display panel is less than a threshold bend angle; and
operate the electronic display panel in a standard power mode based on determining that the bend angle is less than the threshold bend angle.

6. The controller of claim 1, wherein execution of the instructions for updating the value in the strain buffet causes the controller to:
detect a change in state of the electronic display panel, between a folded state and an unfolded state, based on the determined bend angle; and
increment the value responsive to detecting the change in state of the electronic display panel.

7. The controller of claim 1, wherein execution of the instructions for updating the configuration of the electronic display panel causes the controller to:
output an indication signaling a degradation of the electronic display panel based on the history of strain.

8. A method of sensing strain in an electronic display panel, comprising:
receiving sensor signals from one or more piezoresistive sensors disposed in the electronic display panel;
determining an amount of strain on the electronic display panel based on the received sensor signals;
determining a bend angle of the electronic display panel based on the determined amount of strain; and
updating a value in a strain buffer based on the determined amount of strain, the strain buffer storing one or more values indicating a history of strain in the electronic display panel.

9. The method of claim 8, further comprising:
determining that the bend angle of the electronic display panel is greater than a threshold bend angle; and
deactivating the electronic display panel based on determining that the bend angle is greater than the threshold bend angle.

10. The method of claim 8, further comprising:
determining that the bend angle of the electronic display panel is less than a threshold bend angle; and
activating the electronic display panel based on determining that the bend angle does not exceed the threshold bend angle.

11. The method of claim 8, further comprising:
determining that the bend angle of the electronic display panel is greater than a threshold bend angle;

operating the electronic display panel in a low power mode based on determining that the bend angle is greater than the threshold bend angle.

12. The method of claim 8, further comprising:
determining that the bend angle of the electronic display panel is less than a threshold bend angle; and
operating the electronic display panel in a standard power mode based on determining that the bend angle is less than the threshold bend angle.

13. The method of claim 8, wherein the updating of the value in the stain buffer comprises:
detecting a change in state of the electronic display panel, between a folded state and an unfolded state, based on the determined bend angle; and
incrementing the value responsive to detecting the change in state of the electronic display panel.

14. The method of claim 8, wherein the updating of the configuration comprises:
outputting an indication signaling a degradation of the electronic display panel based on the history of strain.

15. A display device, comprising:
an electronic display panel including, a polycrystalline silicon (poly-Si) backplane disposed on a flexible substrate;
one or more piezoresistive sensors disposed in the electronic display panel, each of the one or more piezoresistive sensors including one or more strain gauges formed on the poly-Si backplane; and
a display controller coupled to the one or more piezoresistive sensors and configured to:
receive sensor signals from the one or more piezoresistive sensors;
determine an amount of strain in the electronic display panel based on the received sensor signals;
determine a bend angle of the electronic display panel based on the determined amount of strain; and
update a configuration of the electronic display panel based at least in part on the determined bend angle.

16. The display device of claim 15, wherein the one or more strain gauges are formed by doping the poly-Si backplane.

17. The display device of claim 15, wherein the one or more piezoresistive sensors are disposed outside an active area of the electronic display panel.

* * * * *

UNITED STATES PATENT AND TRADEMARK OFFICE
CERTIFICATE OF CORRECTION

PATENT NO. : 11,488,499 B2
APPLICATION NO. : 17/085359
DATED : November 1, 2022
INVENTOR(S) : Petr Shepelev, Takayuki Noto and Takashi Nose It is certified that error appears in the above-identified patent and that said Letters Patent is hereby corrected as shown below:

In the Claims

In Column 15, Line 52, Claim 1, delete "A controller for an electronic display panel, comprising;" and insert -- A controller for an electronic display panel, comprising: --

In Column 15, Line 54, Claim 1, delete "a memory storing instructions that, when executed the" and insert -- a memory storing instructions that, when executed by the --

In Column 15, Line 66, Claim 2, delete "The controller of claim , wherein execution of the" and insert -- The controller of claim 1, wherein execution of the --

In Column 16, Line 17, Claim 4, delete "panel is greater than a threshold bend angle and" and insert -- panel is greater than a threshold bend angle; and --

In Column 16, Line 18, Claim 4, delete "operate the electronic display panel a low power mode" and insert -- operate the electronic display panel in a low power mode --

In Column 16, Line 29, Claim 6, delete "instructions for updating the value in the strain buffet causes" and insert -- instructions for updating the value in the strain buffer causes --

In Column 16, Lines 37-38, Claim 7, delete "instructions for updating the configuration of the electronic display panel causes the controller to:" and insert -- instructions for updating the value in the strain buffer causes the controller to: --

In Column 16, Line 67, Claim 11, delete "panel is greater than a threshold bend angle;" and insert -- panel is greater than a threshold bend angle; and --

In Column 17, Line 11, Claim 13, delete "value in the stain buffer comprises:" and insert -- value in the strain buffer comprises: --

Signed and Sealed this
Thirteenth Day of June, 2023

Katherine Kelly Vidal
*Director of the United States Patent and Trademark Office*

In Column 17, Line 17, Claim 14, delete "configuration comprises:" and insert -- value in the strain buffer comprises: --

In Column 17, Line 21, Claim 15, delete "an electronic display panel including, a polycrystalline" and insert -- an electronic display panel including a polycrystalline --